US009455678B2

(12) United States Patent
Nguyen

(10) Patent No.: US 9,455,678 B2
(45) Date of Patent: *Sep. 27, 2016

(54) LOCATION AND ORIENTATION BASED VOLUME CONTROL

(71) Applicant: GLOBAL FOUNDRIES INC., Grand Cayman (KY)

(72) Inventor: Duy Q. Nguyen, Tuscon, AZ (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 165 days.

This patent is subject to a terminal disclaimer.

(21) Appl. No.: 14/478,857

(22) Filed: Sep. 5, 2014

(65) Prior Publication Data

US 2015/0139449 A1  May 21, 2015

Related U.S. Application Data

(63) Continuation of application No. 14/083,036, filed on Nov. 18, 2013.

(51) Int. Cl.
*H03G 3/20* (2006.01)
*H03G 3/30* (2006.01)

(52) U.S. Cl.
CPC .............. *H03G 3/20* (2013.01); *H03G 3/3005* (2013.01); *H03G 3/3089* (2013.01)

(58) Field of Classification Search
CPC ..... H03G 3/20; H03G 3/3089; H03G 3/3005
USPC ........... 455/569.2, 569.1; 381/107, 104, 109, 381/315, 312
See application file for complete search history.

(56) References Cited

U.S. PATENT DOCUMENTS

| 3,864,756 | A | 2/1975 | Desimone |
| 4,958,372 | A | 9/1990 | Carter |
| 5,241,971 | A | 9/1993 | Lundin |
| 5,426,719 | A | 6/1995 | Franks et al. |
| 2004/0156512 | A1 | 8/2004 | Parker |
| 2005/0108646 | A1* | 5/2005 | Willins ................... G01S 3/803 715/723 |

(Continued)

FOREIGN PATENT DOCUMENTS

EP  1640972 A1  3/2006

OTHER PUBLICATIONS

Kotarbinska, E. and Kozlowski, E. "Measurement of Effective Noise Exposure of Workers Wearing Ear-Muffs". International Journal of Occupational Safety and Ergonomics (JOSE) 2009. vol. 15, No. 2. pp. 193-200.

(Continued)

*Primary Examiner* — Melur Ramakrishnaiah
(74) *Attorney, Agent, or Firm* — DeLio, Peterson & Curcio, LLC; Kelly M. Nowak

(57) ABSTRACT

A computer manages methods for managing a volume of an audible transmission by, receiving an audible transmission with an associated location and orientation tag, wherein the associated location and orientation tag contains a geographical origin of the audible transmission and a direction of the audible transmission. Determining a location and orientation of a recipient of the audible transmission. Determining a volume level to be associated with the audible transmission based on the determined location and orientation of the recipient with respect to the associated location and orientation tag of the audible transmission.

20 Claims, 5 Drawing Sheets

(56) References Cited

U.S. PATENT DOCUMENTS

| | | | |
|---|---|---|---|
| 2006/0125786 A1* | 6/2006 | Genz | G01C 21/20 345/156 |
| 2008/0008342 A1* | 1/2008 | Sauk | H04S 1/002 381/315 |
| 2009/0262946 A1 | 10/2009 | Dunko | |
| 2011/0209273 A1 | 9/2011 | Fountain et al. | |
| 2012/0220237 A1 | 8/2012 | Beevers | |
| 2013/0047322 A1 | 2/2013 | Peebles | |
| 2013/0279706 A1* | 10/2013 | Marti | G06F 3/165 381/57 |
| 2014/0329567 A1* | 11/2014 | Chan | H04M 1/605 455/569.2 |

OTHER PUBLICATIONS

Nguyen, D. U.S. Appl. No. 14/083,036, filed Nov. 18, 2013.

Rice, C.G. and Coles R. R. A. "Design Factors and Use of Ear Protection". Downloaded from oem.bmj.com on Apr. 5, 2013. Published by group.bmj.com. Brit. J. industr. Med., 1966, 23, 194.

Williams, W. and Groothoff, B. "Road Traffic Controllers And The Use of Level Dependent Hearing Protectors". Technical Note. Acoustics Australia. vol. 39, No. 3-113. Dec. 2011.

"Radio Headset / Peltor Alert Radio Earmuffs". Peltor Alert AM/FM Radio Earmuffs. [online] [retrieved on: Aug. 23, 2013]. Enviro® Safety Products. <http://www.envirosafetyproducts.com/peltor-alert-am-fm-radio-earmuffs.html>.

"Howard Leight / Sync Radio Ear Muffs & Ear Protection Headphones". Radio + Stereo Earmuffs. [online] [retrieved on: Aug. 23, 2013]. <http://www.howardleight.com/ear-protection/radio-stereo/radio-ear-muffs>.

"Howard Leight / Impact Sport". Sound Management / Impact™ Sport. [online] [retrieved on: Aug. 23, 2013]. <http://www.howardleight.com/ear-muffs/impact-sport>.

"Radio + Stereo / Sync Elcto". [online] [retrieved on: Aug. 23, 2013]. <http://www.howardleight.com/ear-muffs/sync-electo>.

* cited by examiner

(12)  US 9,455,678 B2

LOCATION AND ORIENTATION BASED VOLUME CONTROL

FIELD OF THE INVENTION

The present invention relates generally to automated volume control, and more particularly, to adjusting volume according to location and orientation.

BACKGROUND OF THE INVENTION

Hearing protection, such as ear muffs, ear plugs, and noise canceling headphones are often utilized in various applications where loud, ambient noises can contribute to long term hearing loss. An example of such an application can be a construction site where noise levels of construction equipment can reach hearing affecting decibel (dB) levels. However, in such an application, speech from people in the vicinity of the person wearing the hearing protection device may also be attenuated along with the ambient construction noises. Currently, hearing protection devices may contain integrated radios capable of relaying speech among people utilizing a similar frequency to communicate.

However, such hearing devices have a short range microphone that is capable of picking up speech and transmitting it, on a select frequency to any other person dialed into the same frequency that is within range. Since the voices of the other people on the same frequency are audible at the same volume, it can be difficult to distinguish to whom a person is talking to unless the person acknowledges it in the conversation. It can also be distracting for a person not participating in a conversation to have to listen to the conversation which may not pertain to them.

SUMMARY

Embodiments of the present invention disclose a method, computer program product and computer system for managing the volume of an audible transmission. A computer receives an audible transmission with an associated location and orientation tag, wherein the associated location and orientation tag contains a geographical origin of the audible transmission and a direction of the audible transmission. The computer determines a location and orientation of a recipient of the audible transmission. The computer determines a volume level to be associated with the audible transmission based on the determined location and orientation of the recipient with respect to the associated location and orientation tag of the audible transmission.

DETAILED DESCRIPTION

Figure 1:
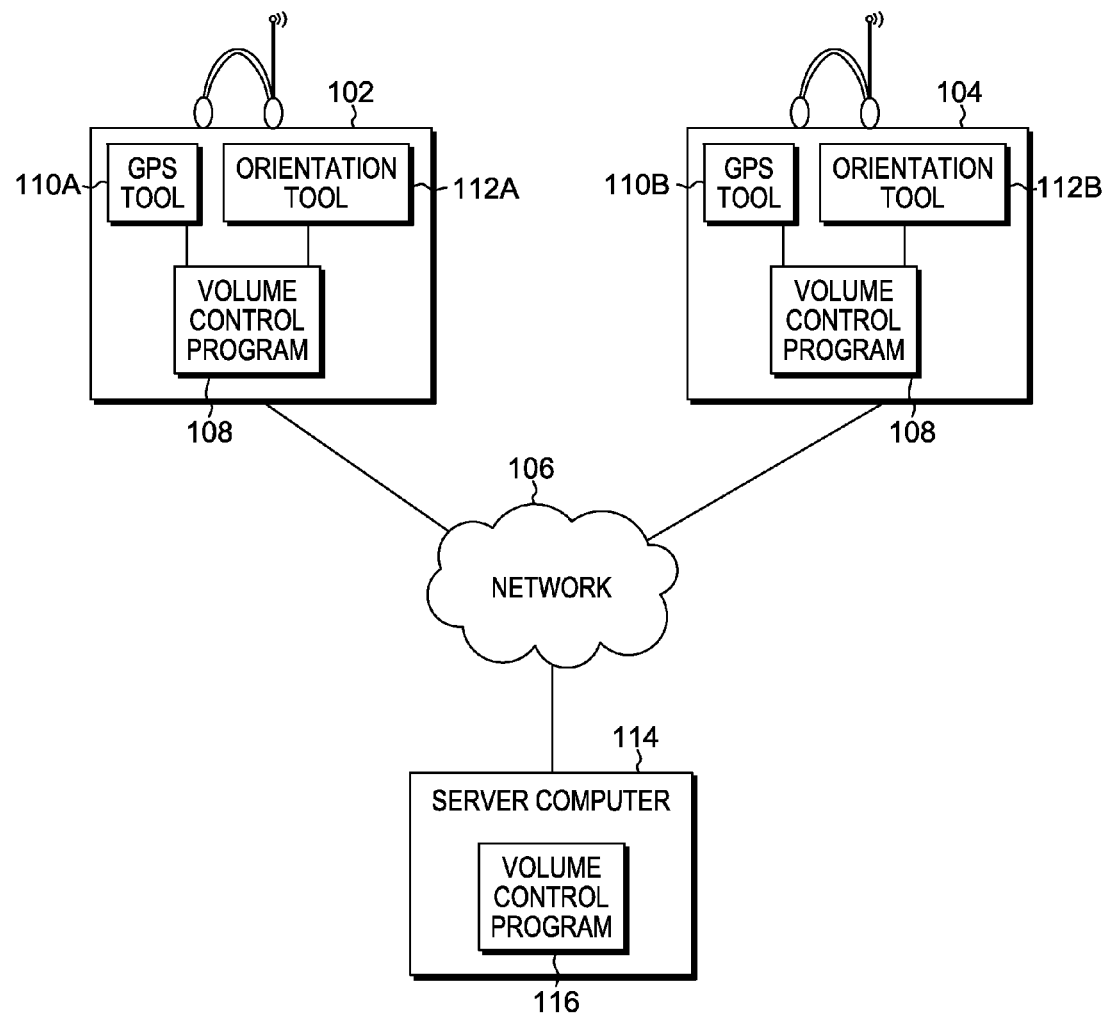
FIG. 1 is a functional block diagram illustrating a distributed data processing environment, in accordance with an embodiment of the present invention.

Embodiments of the present invention manage the volume of an audible transmission between multiple communication devices by having the ability to receive an audible transmission with an associated location and orientation tag. The associated location and orientation tag contain a geographical origin of the audible transmission and a direction of the audible transmission. Embodiments of the present invention also have the ability to determine a location and orientation of a recipient of the audible transmission and determine a volume level to be associated with the audible transmission. The volume of the audible transmission is based on the determined location and orientation of the recipient with respect to the associated location and orientation tag of the audible transmission.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer-readable media having computer readable program code/instructions embodied thereon.

Any combination of computer-readable media may be utilized. Computer-readable media may be a computer-readable signal medium or a computer-readable storage medium. A computer-readable storage medium may be, for example, but is not limited to, an electronic, magnetic, electromagnetic, or semiconductor system, apparatus, or device, or any suitable combination of the foregoing. More specific examples (a non-exhaustive list) of a computer-readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer-readable storage medium may be any tangible medium that can contain, or store a program for use by, or in connection with, an instruction execution system, apparatus or device.

A computer-readable signal medium may include a propagated data signal with computer-readable program code embodied therein, for example, in baseband or as part of a carrier wave. Such a propagated signal may take any of a variety of forms including, but not limited to, electromagnetic, optical, or any suitable combination thereof. A computer-readable signal medium may be any computer-readable medium that is not a computer-readable storage medium and that can communicate, propagate or transport a program for use by, or in connection with, an instruction execution system, apparatus or device.

Program code embodied on a computer-readable medium may be transmitted using any appropriate medium including, but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java®, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture, including instructions, which implements the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

FIG. 1 is a functional block diagram illustrating a distributed data processing environment, in accordance with one embodiment of the present invention. The distributed data processing environment includes computer device 102 and computer device 104 interconnected over network 106.

Communication device 102 and communication device 104 may be a desktop computer, a laptop computer, a tablet computer, a radio headset, a Bluetooth® headset, a smartphone, or any other computer system capable of audible transmission. An audible transmission is any type of audio that can be electronically distributed. For discussion purposes, the audible transmission is associated with communication between a user of communication device 104 to a user of communication device 102.

Volume control program 108 residing in communication devices 102 and 104 has the ability to determine volume levels at which recipients hear an audible transmission. In this embodiment, volume control program 108, located on communication device 102, is receiving an audible transmission from communication device 104. Volume control program 108 can utilize Global Positioning System (GPS) tools 110A and 110B along with orientation tools 112A and 112B respectively, residing in communication device 102 and communication device 104, to determine the volume of the audible transmission from communication device 104 to communication device 102. Volume control program 108 can receive the audible transmission with the associated GPS and orientation tag, utilize GPS tool 110A and orientation tool 112A and identify the location of communication device 104 with relation to communication device 102. In another embodiment, a server based volume control program 116 resides in server computer 114 and can perform the same functions as previously mentioned in the discussion of volume control program 108.

GPS tools 110A and 110B have the ability to identify the geographical location of the respective communication devices 102 and 104 on which GPS tools 110A and 110B reside. In one embodiment, GPS tools 110A and 110B can utilize longitudinal and latitudinal coordinates to determine the location of each respective communication device 102 and 104.

In another embodiment, if communication device 102 and communication device 104 are cellular based, triangulation tools, not illustrated in FIG. 1, can utilize cellular tower triangulation to determine the location of each communication device 102 and 104. The triangulation's tools can use the known locations of at least three fixed cellular towers to determine the approximate distance from each of the at least three fixed cellular towers. In such an embodiment, the triangulation tools send the location of each respective communication device in the form of a location tag that can be associated with an audible transmission.

Orientation tools 112A and 112B have the ability to identify the orientation of the respective communication devices 102 and 104 in which orientation tools 112A and 112B respectively reside. In one embodiment, orientation tools 112A and 112B can utilize an electronic compass capable of determining a deviation from a polar heading of each respective communication device 102 and 104. In such an embodiment, orientation tools 112A and 112B sends the orientation of each respective communication device in the form of an orientation tag that can be associated with an audible transmission.

In general, network 106 can be any combination of connections and protocols that can support communications between communication device 102 and communication device 104. Network 106 can include, for example, a local area network (LAN), a wide area network (WAN) such as the internet, a cellular network or any combination of the preceding, and can further include wired, wireless, and/or fiber optic connections. In this embodiment, network 106 is a decentralized network, for example, an ad hoc network where communication device 102 and communication device 104 are capable of communicating with one and other without the use of an existing communications infrastructure. An example of an ad hoc network can be communication device 104 communicating with communication device 102 via Bluetooth®.

In another embodiment, volume control program 108 may be a web service accessible via network 106 to a user of a separate device, e.g., server computer 114. Server computer 114 may be a desktop computer, a laptop computer, a tablet computer, a specialized computer server, a smartphone or any other computer system known in the art. Server computer 114 can represent a communications infrastructure to which communication device 102 and communication device 104 are connected via network 106.

Figure 2:
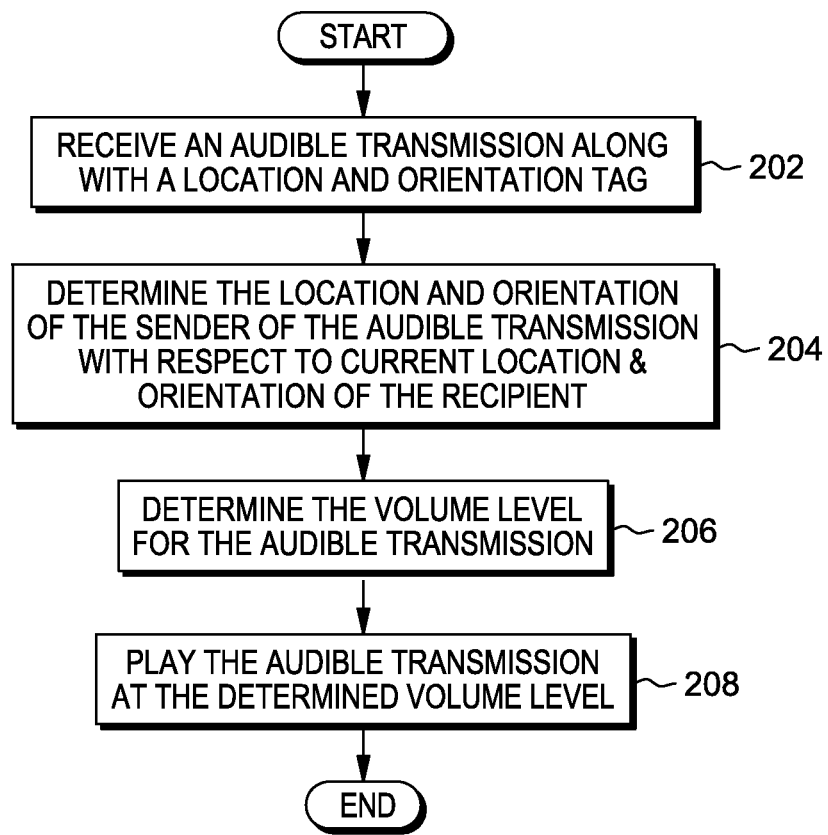
FIG. 2 is a flowchart depicting operational steps of an embodiment of a volume control program for determining volume levels for an audible transmission, in accordance with an embodiment of the present invention.

FIG. 2 is a flowchart depicting operational steps of volume control program 108 for determining volume levels for an audible transmission, in accordance with an embodiment of the present invention.

Volume control program 108 receives an audible transmission along with a location and orientation tag (step 202). In this embodiment, communication device 102 is receiving an audible transmission, such as a user of communication device 104 saying "hello" to the user of communication device 102. The audible transmission is accompanied with an associated location and orientation tag. In this embodiment, the location tag is generated by a Global Positioning System (GPS) device, such as GPS tool 110B. The GPS device can continuously identify the location of communication device 104 and send the longitudinal and latitudinal coordinates in the form of a GPS tag with the audible transmission. In another embodiment, the location tag is generated by a triangulation based system. The triangulation based system can utilize a 3 point signal system to determine the approximate location of communication device 104.

The orientation tag can be generated from an electronic compass, such as orientation tool 112B on communication device 104. The electronic compass can be integrated into communication device 104 in such a way that the degree deviation from a polar heading can represent the orientation of the user of communication device 104. The orientation of the user can represent the direction the user can be facing and talking towards.

Volume control program 108 determines the location and orientation of the sender of the audible transmission, with respect to current location and orientation of the recipient (step 204). In this embodiment, the recipient of the audible transmission is user of communication device 102. Volume control program 108 is capable of querying a local location and orientation tool, such as GPS tool 110A and orientation tool 112A, to determine the location and orientation of the user of communication device 102. Volume control program 108 can query a local location tool, such as a GPS device or triangulation based system found similarly on communication device 104, to identify the location of the recipient (i.e., the user of communication device 102). Volume control program 108 can query a local orientation tool, such as an electronic compass found similarly on communication device 104, to identify the orientation of the user of communication device 102.

Utilizing the local location and orientation of communication device 102 and the previously received location and orientation tags of communication device 104, volume control program 108 can determine the distance and orientation difference between the two users of the communication devices. For example, if a GPS device was utilized to identify the location of each user of communication device 102 and 104, volume control program 108 can utilize the coordinates, (i.e., latitude and longitude) of each respective communication device 102 and 104 to calculate the distance between both coordinates. Volume control program 108 also has the ability to be user programmed with coordinates for obstacles, which can exist where the users of communication device 102 and 104 are located. Such obstacles can, for example, include a wall and can affect the manner in which regular speech is heard when one person is in communication with another person. Such obstacles can be programmed into volume control program 108, and volume control program 108 can take into account such obstacles when determining the volume for audible transmissions between communication device 102 and 104.

If an electronic compass were utilized to identify the orientation of each user of communication device 102 and 104, then the deviation from a polar heading can represent the orientation for each of the users. For example, the user of communication device 104 has an orientation reading of "180° N", which translates into the user of communication device 104 facing a 180° deviation from the North heading. The user of communication device 102 has an orientation reading of "0° N", which translates into the user of communication device 102 facing 0° deviation from the North heading. In this example, the user of communication device 104 is facing the user of communication device 102 when transmitting an audible transmission.

Volume control program 108 determines the volume level for the audible transmission (step 206) utilizing a preprogrammed algorithm for variation in volume based on distance and orientations of the users of communication device 102 and 104. For example, the greater the distance between the users of communication device 102 and 104, volume control program 108 associates a lower volume to audible transmissions between the two users. Volume control program 108 utilizes an inverse correlation to determine a volume to associate with the audible transmission based on the distance between two locations. Such an inverse correlation represents how volume is perceived by a first person listening to a second person, as the second person is walking away from the first person.

As previously mentioned, volume control program 108 has the ability to determine if any obstacles exist between the users of communication device 102 and 104. A user can program the location of the obstacles, as well as the type of obstacle into volume control program 108. An obstacle, such as a concrete wall, has a better ability to insulate noises (i.e., a person speaking), than another obstacle, such as a fence. Therefore, the sounds behind the fence are typically easier to hear and are, thus, perceived as louder when compared to the sounds behind the concrete wall. Volume control program 108 can take into account how sounds are perceived through such obstacles and can determine to alter the volume associated with the audible transmission accordingly. Volume control program 108 can also alter a clarity level of the audible transmission, along with the volume, depending on the obstacle. For example, if volume control program 108 determines there is an obstacle, such as a concrete wall between the users of communication device 102 and 104, volume control program 108 can determine to decrease the volume and clarity (i.e., muffle) levels associated with the audible transmission.

Volume control program 108 has the ability to simulate the direction from which the audible transmission is coming. In an example, a user of communication device 102 is orientated "0° N" (i.e., facing North) and a user of communication device 104, located to the right of the user of communication device 102, is oriented "270° N" (i.e., facing West). If communication device 102 is a headset with a left and a right speaker for each ear of the user, volume control program 108 can determine to assign one volume level associated with the audible transmission to the right speaker and a second volume level associated with the audible transmission to the left speaker. In this example, volume control program 108 assigns a greater volume level in the right speaker than the volume level in the left speaker. The user of communication device 102 can determine, based on the two different volume levels in the left and right speaker, that the user of communication device 104 is located to the right.

In another embodiment, communication device 102 is a surround sound headset with incorporated noise cancellation. Volume control program 108, through the use of the surround sound headset, has the ability to further simulate the direction from which the audible transmission is coming (i.e., communication device 104). For example, surround sound headsets can adjust the audio output for instances when audible transmissions are directed from the front or the back of the user of communication device 102. Volume control program 108 can determine the volume of the audible transmission and, in conjunction with the capabilities of the surround sound head set, reproduce the audible transmission for the user of communication device 102.

Volume control program 108 plays the audible transmission at the determined volume level (step 208). Subsequent to volume control program 108 determining the volume level associated with the audible transmission, volume control program 108 plays the audible transmission at the determined volume on communication device 102. In another embodiment, a volume control unit on communication device 102 can receive the determined volume and the volume control unit on communication device 102 can adjust the volume accordingly. As previously discussed, depending on the type of device, volume control program 108 can have multiple volume levels for each speaker of communication device 102.

Figure 3:
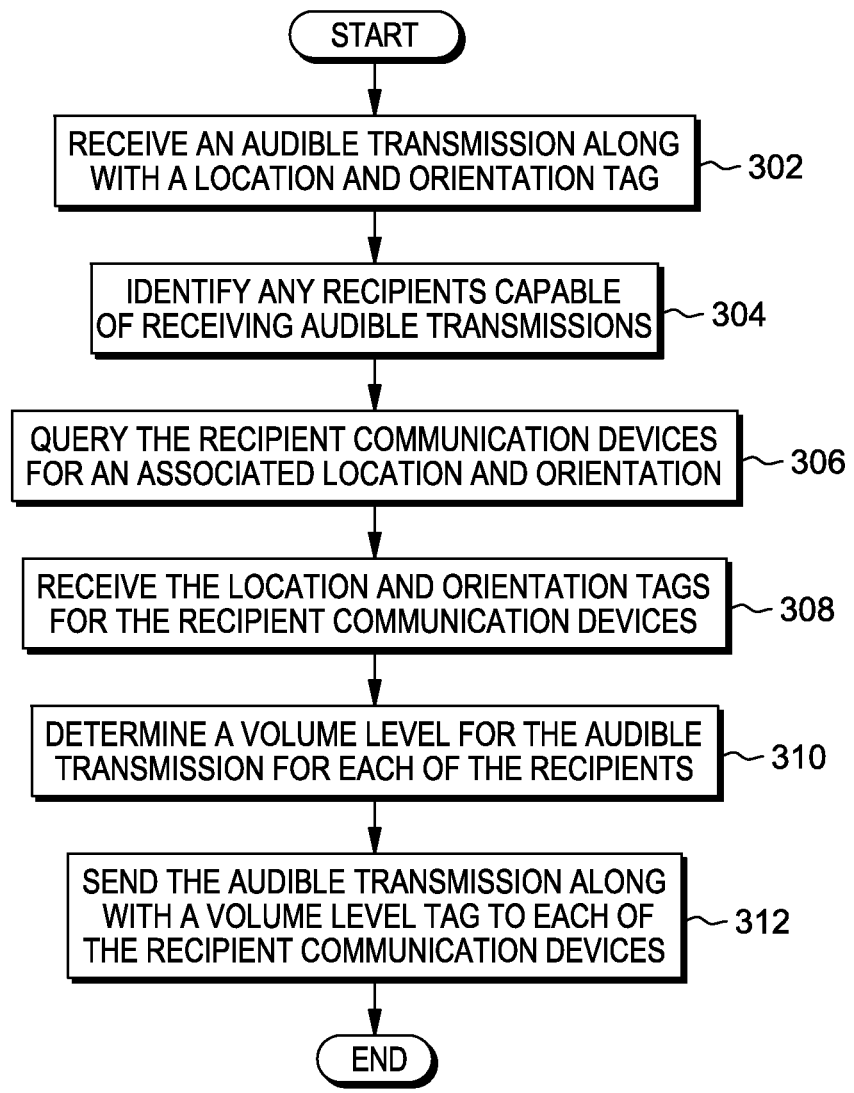
FIG. 3 is a flowchart depicting operational steps of another embodiment of a volume control program for determining volume levels for an audible transmission, in accordance with an embodiment of the present invention.

FIG. 3 is a flowchart depicting operational steps of volume control program 108 for determining volume levels for an audible transmission, in accordance with another embodiment of the present invention.

Volume control program 108 receives an audible transmission along with a location and orientation tag (step 302). In this embodiment, volume control program 108 is located on server computer 114, where server computer 114 is a central receiver for communications between users of communication devices. Communication device 104 is sending the audible transmission that volume controller program 108 receives. An example of an audible transmission that volume controller program 108 receives from the user of communication device 104 is the user saying "hello" to any listening users with communications devices connected to server computer 114. The location and orientation tag correspond to the location and orientation of the user of computer device 104.

Volume control program 108 identifies any recipients capable of receiving audible transmissions (step 304). In one embodiment, volume control program 108 can access a list of communication devices connected to server computer 114 to identify any recipients to which the received audible transmission may be directed. The list can contain communication devices actively receiving audible transmissions or passively receiving audible transmissions. A communication device that volume control program 108 identifies as passively receiving audible transmissions, can also identify the communication device as not being a recipient. In this embodiment, volume control program 108 identifies communication device 102 as a recipient capable of receiving the audible transmission received from communication device 104 in step 302.

Volume control program 108 queries the recipient communication devices for an associated location and orientation (step 306). Continuing with the previously mentioned example, volume control program 108 queries the recipient (i.e., communication device 102) for the location and orientation. In one embodiment, volume control program 108 can directly query GPS tool 110A for the location and orientation tool 112A for the orientation of communication device 102.

Volume control program 108 receives location and orientation tags for the recipient communication device (step 308). Volume control program 108 receives the location and orientation tags for communication device 102. In one embodiment, if the location tags are GPS based, then volume control program 108 can determine the distance between communication device 102 and 104. In another embodiment, where the location tags are triangulation based, volume control program 108 can use a known position of server computer 114, previously defined by a user, to better determine the distance between communication device 102 and 104. For example, volume control program 108 can approximate the distance of communication device 102 and 104 depending on a difference in time stamps between an audible message being sent to and received by volume control program 108. This allows for volume control program 108 to better isolate a point, in each respective triangulation area, where communication devices 102 and 104 can be located.

Volume control program 108 determines a volume level for the audible transmission for each of the recipients (step 310). Utilizing the received location and orientation tags for communication device 102 and 104, volume control program 108 can determine the volume level to associate with the audible transmission. Volume control program 108 can have a user programmed list of fixed obstacles which can affect the volume levels volume control program 108 assigns to a received audible transmission.

Volume control program 108 sends the audible transmissions along with a volume level tag to each of the recipient communication devices (step 312). Volume control program 108 sends the audible transmission to the identified recipient, i.e., communication device 102, along with the volume level tag at which communication device 102 should play the audible transmission. The volume level tag specifies how communication device 102 should play the audible communication. A volume control unit on communication device 102 can receive the determined volume and the volume control unit on communication device 102 can adjust the volume accordingly, for example, whether communication device 102 via the volume control unit should play the audible transmission at two different volumes for two different speakers, or whether to alter the clarity to mimic an obstacle interfering with the audible transmission.

Figure 4:
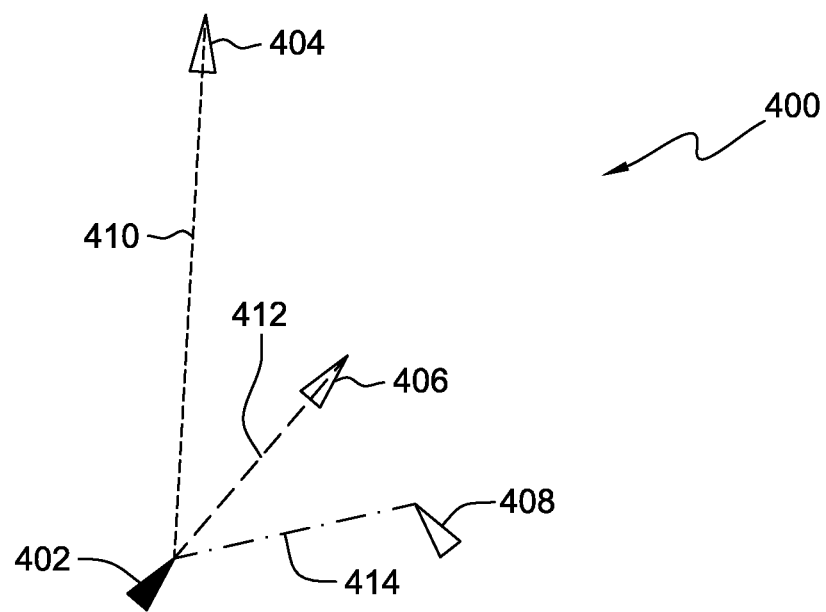
FIG. 4 illustrates a scenario for which a volume control program determines volume levels for an audible transmission, in accordance with an embodiment of the present invention.

FIG. 4 illustrates a scenario for which volume control program 108 determines volume levels for an audible transmission, in accordance with an embodiment of the present invention.

Location and orientation map 400 is a visual representation of information that volume control program 108 collects when determining the volume level of the received audible transmission. In this embodiment, communication devices 402, 404, 406, and 408 are part of the same network where every communication device is capable of communicating with one and other. For discussion purposes, communication device 402 is receiving an audible transmission from each communication device 404, 406, and 408. With each of the audible transmissions, there is an associated location and coordination tag for each communication device 404, 406, and 408.

The location tag allows for volume control program 108 to determine the location of communication device 404, 406, and 408 with relation to communication device 402, which is receiving the multiple audible transmissions. Distance line 410 represents the distance between communication device 402 and 404, distance line 412 represents the distance between communication device 402 and 406, and distance line 414 represents the distance between communication device 402 and 408. Distance line 412 and 414 are the same length and shorter than distance line 410.

The orientation tag allows for volume control program 108 to further determine a possible direction the user of each of communication devices 404, 406, and 408 may be facing. The orientation of communication device 402 is "30° N", the orientation of communication device 404 is "0° N", the orientation of communication device 406 is "30° N", and the orientation of communication device 408 is "315° N". Though distance line 412 is the same length as distance line 414, volume control program 108 assigns a higher volume level for an audible transmission from communication device 408 than an audible transmission from communication device 406. This is due to there being a 180° difference between the orientation of communication device 402 and 406, while there is a 105° difference between the orientation of communication device 402 and 408. The smaller the difference between the orientations, the higher the volume level volume control 108 assigns.

Figure 5:
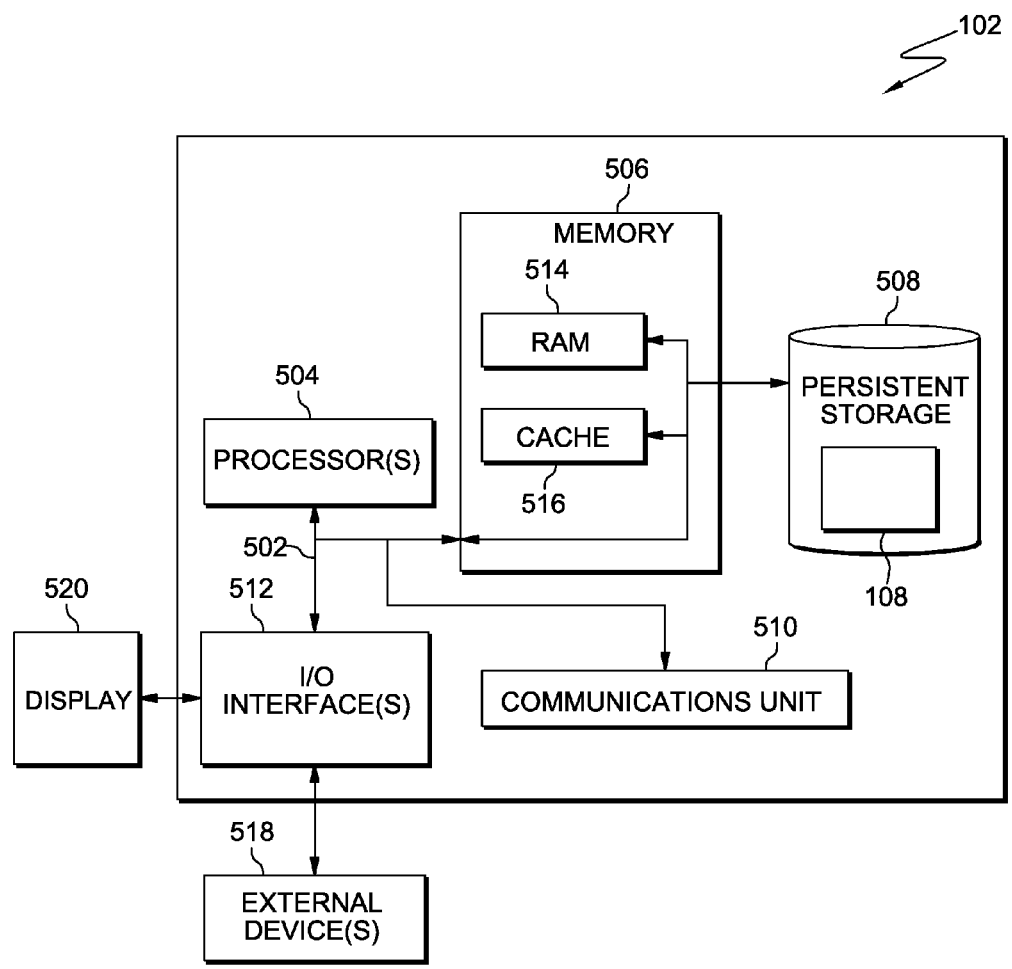
FIG. 5 is a block diagram of components of a computer system, such as the computer server of FIG. 1, in accordance with an embodiment of the present invention.

FIG. 5 depicts a block diagram of components of a computer, such as communication device 102, operating volume control program 108 within the distributed data processing environment, in accordance with an illustrative embodiment of the present invention. It should be appreciated that FIG. 5 provides only an illustration of one implementation and does not imply any limitations with regard to the environments in which different embodiments may be implemented. Many modifications to the depicted environment may be made.

Communication device 102 includes communications fabric 502, which provides communications between computer processor(s) 504, memory 506, persistent storage 508, communications unit 510, and input/output (110) interface(s) 512. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer-readable storage media. In this embodiment, memory 506 includes random access memory (RAM) 514 and cache memory 516. In general, memory 506 can include any suitable volatile or non-volatile computer-readable storage medium.

Volume control program 108 stored in persistent storage 508 for execution by one or more of computer processors 504 via one or more memories of memory 506. In this embodiment, persistent storage 508 includes a magnetic hard disk drive. Alternatively, or in addition to a magnetic hard disk drive, persistent storage 508 can include a solid state hard drive, a semiconductor storage device, read-only memory (ROM), erasable programmable read-only memory (EPROM), flash memory or any other computer-readable storage medium that is capable of storing program instructions or digital information.

The media used by persistent storage 508 may also be removable. For example, a removable hard drive may be used for persistent storage 508. Other examples include optical and magnetic disks, thumb drives and smart cards that are inserted into a drive for transfer onto another computer-readable storage medium that is also part of persistent storage 508.

Communications unit 510, in these examples, provides for communications with other data processing systems or devices, including systems and devices within or controlled by communication device 102. In these examples, communications unit 510 includes one or more wireless network interface cards. Communications unit 510 may provide communications through the use of either or both physical and wireless communications links. Computer programs and processes, such as volume control program 108, may be downloaded to persistent storage 508 through communications unit 510, or uploaded to another system through communications unit 510.

I/O interface(s) 512 allows for input and output of data with other devices that may be connected to communication device 102. For example, I/O interface 512 may provide a connection to external devices 518 such as a keyboard, keypad, a touch screen, and/or some other suitable input device. External devices 518 can also include portable computer-readable storage media such as, for example, thumb drives, portable optical or magnetic disks, and memory cards. Software and data used to practice embodiments of the present invention can be stored on such portable computer-readable storage media and can be loaded onto persistent storage 508 via I/O interface(s) 512. I/O interface(s) 512 may also connect to a display 520.

Display 520 provides a mechanism to display data to a user and may be, for example, a touch screen, a heads-up display, or a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for managing a volume of an audible transmission, the method comprising:
 transmitting from a first communication device an audible transmission with an associated location and orientation tag;
 receiving the audible transmission with the associated location and orientation tag at a second communication device, wherein the associated location and orientation tag contains a geographical origin of the audible transmission and a direction of the audible transmission;

determining, by one or more processors, a location and orientation of the second communication device receiving the audible transmission;

determining, by one or more processors, a volume level to be associated with the audible transmission based on the determined location and orientation of the second communication device recipient with respect to the associated location and orientation tag of the audible transmission;

identifying, by a volume control program, types of any obstacles and location coordinates of said obstacles residing between said first communication device and said second communication device recipient that can affect the audible transmission; and adjusting, by one or more processors of the volume control program, the volume level to be associated with the audible transmission based on said type of obstacles and location coordinates thereof residing between said first communication device and said second communication device so that the volume level to be associated with the audible transmission takes into account said obstacles.

2. The method of claim 1, wherein determining a location and orientation of the second communication device recipient of the audible transmission, comprises:

identifying, by one or more processors, the second communication device recipient in the vicinity of the audible transmission;

querying, by one or more processors, the identified second communication device recipient for the location and orientation of the identified second communication device recipient; and receiving, by one or more processors, the location and orientation of the identified second communication device recipient.

3. The method of claim 2, further comprising:

sending, by one or more processors, the audible transmissions to the identified second communication device recipient along with a volume tag, wherein the volume tag indicates the determined volume level at which to play the audible transmission.

4. The method of claim 1, wherein determining a location and orientation of the second communication device recipient of the audible transmission, comprises:

querying, by one or more processors, a local location identification tool for a geographical location of the second communication device recipient of the audible transmission;

querying, by one or more processors, a local orientation identification tool for a direction of the second communication device recipient of the audible transmission; and receiving, by one or more processors, the location and the orientation of the second communication device recipient of the audible transmission.

5. The method of claim 4, further comprising:

playing, by one or more processors, the received audible transmission at the determined volume level.

6. The method of claim 4, wherein the determination of the geographical location of the second communication device recipient is based, at least in part, on one or both of data received from a global positioning system and a triangulation based system.

7. The method of claim 4, wherein the determination of the direction of the second communication device recipient is based, at least in part, on data received from an electronic compass, wherein the direction of the audible transmission is based on a polar heading of the electronic compass.

8. A non-transitory computer program product for managing a volume of an audible transmission, the non-transitory computer program product comprising:

one or more non-transitory computer readable storage media;

a volume control program including program instructions stored on the one or more non-transitory computer readable storage media, which when executed by one or more processors, to:

receive, by one or more processors of the volume control program, an audible transmission from a first communication device having an associated location and orientation tag, wherein the associated location and orientation tag contains a geographical origin of the audible transmission and a direction of the audible transmission;

determine, by one or more processors of the volume control program, a location and orientation of a second communication device recipient of the audible transmission;

determine, by one or more processors of the volume control program, a volume level to be associated with the audible transmission based on the determined location and orientation of the second communication device recipient with respect to the associated location and orientation tag of the audible transmission, said volume control program including identifications of types of any obstacles and location coordinates of said obstacles residing between said first communication device and said second communication device recipient that can affect the audible transmission; and adjust, by one or more processors of the volume control program, the volume level to be associated with the audible transmission based on said type of obstacles and location coordinates thereof residing between said first communication device and said second communication device so that the volume level to be associated with the audible transmission takes into account said obstacles.

9. The non-transitory computer program product of claim 8, wherein determining the location and orientation of the second communication device recipient of the audible transmission, comprises program instructions, stored on the one or more non-transitory computer readable storage media, which when executed by a processor, to:

identify, by one or more processors of the volume control program, the second communication device recipient in the vicinity of the audible transmission;

query, by one or more processors of the volume control program, the identified second communication device recipient for the location and orientation thereof; and receive, by one or more processors of the volume control program, the location and orientation of the identified second communication device recipient.

10. The non-transitory computer program product of claim 9, further comprising program instructions, stored on the one or more non-transitory computer readable storage media, which when executed by a processor, to:

send, by one or more processors of the volume control program, the audible transmissions to the identified second communication device recipient along with a volume tag, wherein the volume tag indicates the determined volume level at which to play the audible transmission.

11. The non-transitory computer program product of claim 8, wherein determining the location and orientation of the second communication device recipient of the audible transmission, comprises program instructions, stored on the one or more non-transitory computer readable storage media, which when executed by a processor, to:
 query, by one or more processors of the volume control program, a local location identification tool for a geographical location of the second communication device recipient of the audible transmission;
 query, by one or more processors of the volume control program, a local orientation identification tool for a direction of the second communication device recipient of the audible transmission; and
 receive, by one or more processors of the volume control program, the location and the orientation of the second communication device recipient of the audible transmission.

12. The non-transitory computer program product of claim 11, further comprising program instructions, stored on the one or more non-transitory computer readable storage media, which when executed by a processor, to:
 play, by one or more processors, the received audible transmission at the determined volume level.

13. The non-transitory computer program product of claim 11, wherein the determination of the geographical location of the second communication device recipient is based, at least in part, on one or both of data received from a global positioning system and a triangulation based system.

14. The non-transitory computer program product of claim 11, wherein the determination of the direction of the second communication device recipient is based, at least in part, on data received from an electronic compass, wherein the direction of the audible transmission is based on a polar heading of the electronic compass.

15. A computer system for managing a volume of an audible transmission, the computer system comprising:
 one or more computer processors;
 one or more non-transitory computer readable storage media;
 a volume control program including program instructions stored on the one or more non-transitory computer readable storage media for execution by at least one of the one or more computer processors, which when executed, to:
 receive, by one or more processors of the volume control program, multiple audible transmissions with associated location and orientation tags from multiple communication device recipients, wherein the associated location and orientation tags each contain a geographical origin of each audible transmission and a direction of each audible transmission for each of the multiple communication device recipients;
 determine, by one or more processors of the volume control program, a location and orientation of one or more of the multiple communication device recipients of the one or more audible transmission; and
 determine, by one or more processors of the volume control program, one or more different volume levels to be associated with the one or more audible transmissions based on the determined location and orientation of the one or more communication device recipients with respect to the associated location and orientation tag of the audible transmission,
 said volume control program identifies types of any obstacles and location coordinates of said obstacles residing between the two or more communication device recipients and the associated location and orientation tag that can affect the audible transmissions; and
 adjust, by one or more processors of the volume control program, the volume level to be associated with the audible transmissions based on said type of obstacles and location coordinates thereof residing between said two or more communication device recipients so that the volume level to be associated with the audible transmission takes into account said obstacles.

16. The computer system of claim 15, wherein determining the location and orientation of the second communication device recipient of the audible transmission, comprises program instructions, stored on the one or more non-transitory computer readable storage media, which when executed by a processor, to:
 identify, by one or more processors of the volume control program, multiple communication device recipients in the vicinity of the audible transmission;
 query, by one or more processors of the volume control program, the identified multiple communication device recipients for the location and orientation of each said identified recipient; and
 receive, by one or more processors of the volume control program, the location and orientation for each identified recipient.

17. The computer system of claim 16, further comprising program instructions, stored on the one or more non-transitory computer readable storage media, which when executed by a processor, to:
 send, by one or more processors of the volume control program, the audible transmissions to the identified one or more communication device recipients along with one or more volume tags, wherein the volume tags indicate the determined volume level at which to play the audible transmission for each said one or more communication device recipient.

18. The computer system of claim 15, wherein determining the location and orientation of the second communication device recipient of the audible transmission, comprises program instructions, stored on the one or more non-transitory computer readable storage media, which when executed by a processor, to:
 query, by one or more processors of the volume control program, a local location identification tool for a geographical location of one or more communication device recipients of the audible transmission;
 query, by one or more processors of the volume control program, a local orientation identification tool for a direction of the one or more communication device recipients of the audible transmission; and
 receive, by one or more processors of the volume control program, the location and the orientation of the one or more communication device recipients of the audible transmission.

19. The computer system of claim 18, wherein the determination of the geographical location of the communication device recipient is based, at least in part, on one or both of data received from a global positioning system and a triangulation based system.

20. The computer system of claim 18, wherein the determination of the direction of the communication device recipient is based, at least in part, on data received from an electronic compass, wherein the direction of the audible transmission is based on a polar heading of the electronic compass.

* * * * *